(12) United States Patent
Lee

(10) Patent No.: US 8,318,571 B2
(45) Date of Patent: Nov. 27, 2012

(54) METHOD FOR FORMING P-TYPE LIGHTLY DOPED DRAIN REGION USING GERMANIUM PRE-AMORPHOUS TREATMENT

(75) Inventor: Chia Hao Lee, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 234 days.

(21) Appl. No.: 12/258,375

(22) Filed: Oct. 24, 2008

(65) Prior Publication Data

US 2010/0003799 A1 Jan. 7, 2010

(30) Foreign Application Priority Data

Jul. 3, 2008 (CN) .......................... 2008 1 0040289

(51) Int. Cl.
*H01L 21/336* (2006.01)

(52) U.S. Cl. ........ 438/305; 438/301; 438/303; 438/519; 438/522; 438/527; 257/327; 257/335; 257/344; 257/408; 257/E21.433

(58) Field of Classification Search .................. 438/142, 438/197, 299, 301, 306, 307, 303, 305, 513, 438/514, 515, 528, 530, 519, 522, 527; 257/213, 257/288, 327, 335, 336, 344, 347, 408, E21.433
See application file for complete search history.

(56) References Cited

U.S. PATENT DOCUMENTS

| | | | | |
|---|---|---|---|---|
| 6,037,640 A * | 3/2000 | Lee | ............................... | 257/408 |
| 6,743,687 B1 * | 6/2004 | Yu | ............................... | 438/303 |
| 2003/0222289 A1 * | 12/2003 | Nakamura | ..................... | 257/274 |
| 2005/0202657 A1 * | 9/2005 | Borland et al. | ............... | 438/514 |
| 2007/0238234 A1 * | 10/2007 | Wang et al. | ................... | 438/197 |
| 2008/0023732 A1 * | 1/2008 | Felch et al. | .................... | 257/288 |
| 2008/0102588 A1 * | 5/2008 | Lee et al. | ....................... | 438/305 |

OTHER PUBLICATIONS

Borland, John; Kiyama, Hiroki; Comparison of B, BF2, & B18H22 for Extension and BF2, B18H22 & In HALO Implantation for 32 nm Node Using Various Diffusion-less Annealing Techniques; AIP Conf. Proc. 1066, Ion Implantation Technology: 17th International Conference on Ion Implantation Technology; Date: Jun. 8-13, 2008; pp. 63-66.*

* cited by examiner

*Primary Examiner* — N Drew Richards
*Assistant Examiner* — John P Dulka
(74) *Attorney, Agent, or Firm* — Kilpatrick Townsend & Stockton LLP

(57) ABSTRACT

A method for forming a MOS device with an ultra shallow lightly doped diffusion region includes providing a gate dielectric layer overlying a substrate surface region, forming a gate structure overlying the gate dielectric layer, performing a first implant process using a germanium species to form an amorphous region within an LDD region using the gate structure as a mask, and performing a second implant process in the LDD region using a P-type impurity and a carbon species. A first thermal process activates the P-type impurity in the LDD region, forming side wall spacers overlying the gate structure, and performing a third implant process using a first impurity to form active source/drain regions in a vicinity of the surface region adjacent to the gate structure using the gate structure and the spacers as a mask. A second thermal process then activates the first impurity in the active source/drain regions.

14 Claims, 9 Drawing Sheets

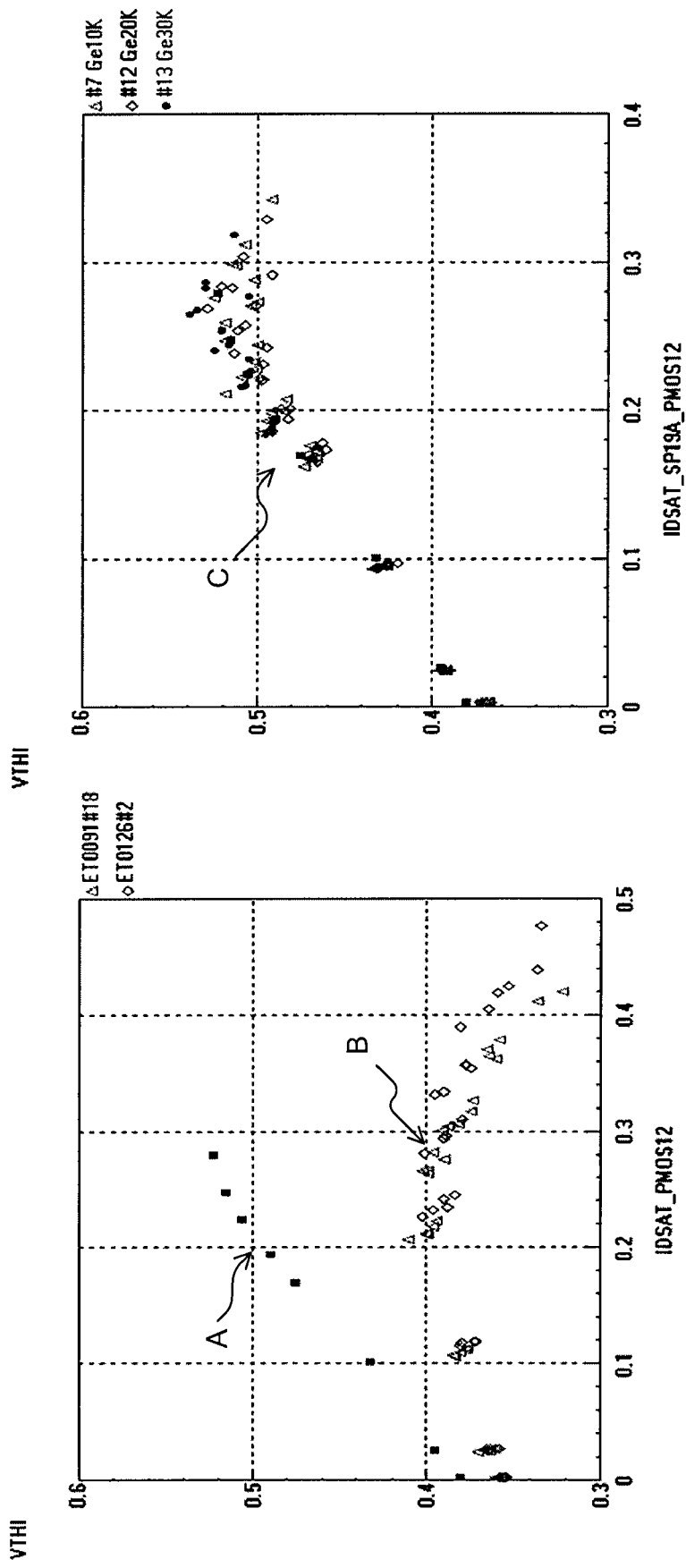

METHOD FOR FORMING P-TYPE LIGHTLY DOPED DRAIN REGION USING GERMANIUM PRE-AMORPHOUS TREATMENT

CROSS-REFERENCE TO RELATED APPLICATIONS

This application claims priority to Chinese Patent Application No. 200810040289.4, filed Jul. 3, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method and a structure for manufacturing a MOS device having a ultra shallow lightly doped drain regions. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed.

An example of such a limit is in ultra shallow source drain regions processing. As device line width is reduced, lateral diffusion of dopants needs to be controlled to prevent punch through and impact device performance. These and other limitations will be described in further detail throughout the present specification and more particularly below.

From the above, it is seen that an improved technique for processing semiconductor devices is desired.

BRIEF SUMMARY OF THE INVENTION

According to embodiments of the present invention, a method for forming a MOS device. More particularly, the embodiments according to the present invention provide a method and a structure for manufacturing of a MOS device with an ultra shallow lightly doped diffusion region. Merely by ways of example, the present invention has been applied to manufacturing of a MOS structure having a line width of 65 nm and less. But it would be recognized that the present invention has a broader range of applicability.

In a specific embodiment, the method includes providing a semiconductor substrate including a surface region. The method also forms a gate dielectric layer overlying the surface region of the semiconductor substrate. A gate structure is formed overlying a portion of the gate dielectric layer. In a specific embodiment, the method performs a first implant process using a germanium species to form an amorphous region within a lightly doped drain region in the semiconductor substrate using at least the gate structure as a mask. The method also includes performing a second implant process in the lightly doped drain region using a P type impurity and a carbon species using the gate structure as a mask. A first thermal process is performed to activate the P type impurity in the lightly doped drain region. The method includes forming side wall spacer structures overlying a portion of the gate structure and performing a third implant process using a first impurity to form active source/drain regions in a vicinity of the surface region of the semiconductor substrate adjacent to the gate structure using the gate structure and the side wall spacer as a masking layer. The method also includes performing a second thermal process to activate the first impurity in the active source/drain regions. Preferably, the MOS device is characterized by a line width of 65 nm and less.

Many benefits are achieved by way of the present invention over conventional techniques. For example, the present technique provides an easy to use process that relies upon conventional technology. In a specific embodiments, the present method allows for an LDD region having a reduced transient enhanced diffusion profile. In some embodiments, the method provides higher device yields in dies per wafer. In some embodiments, the method provides MOS devices having improved threshold leakage current, Idsat, and Ioff, among others. Additionally, the method provides a process that is compatible with conventional process technology without substantial modifications to conventional equipment and processes. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 9-15 are simplified diagrams exemplified experiment results according to embodiments of the present invention.

DETAILED DESCRIPTION OF THE INVENTION

According to the present invention, techniques including methods and resulting structures for manufacture of semiconductor devices are provided. More particularly, the invention provides a method and device structure for forming an ultra shallow junction MOS device for the manufacture of integrated circuits. Merely by way of example, the invention has been applied to manufacturing of an ultra shallow junction MOS device using an ultra shallow lightly doped drain geometry. The present invention has been applied to manufacturing of a MOS structure having a line width of 65 nm and less. But it would be recognized that the present invention has a broader range of applicability.

Figure 1:
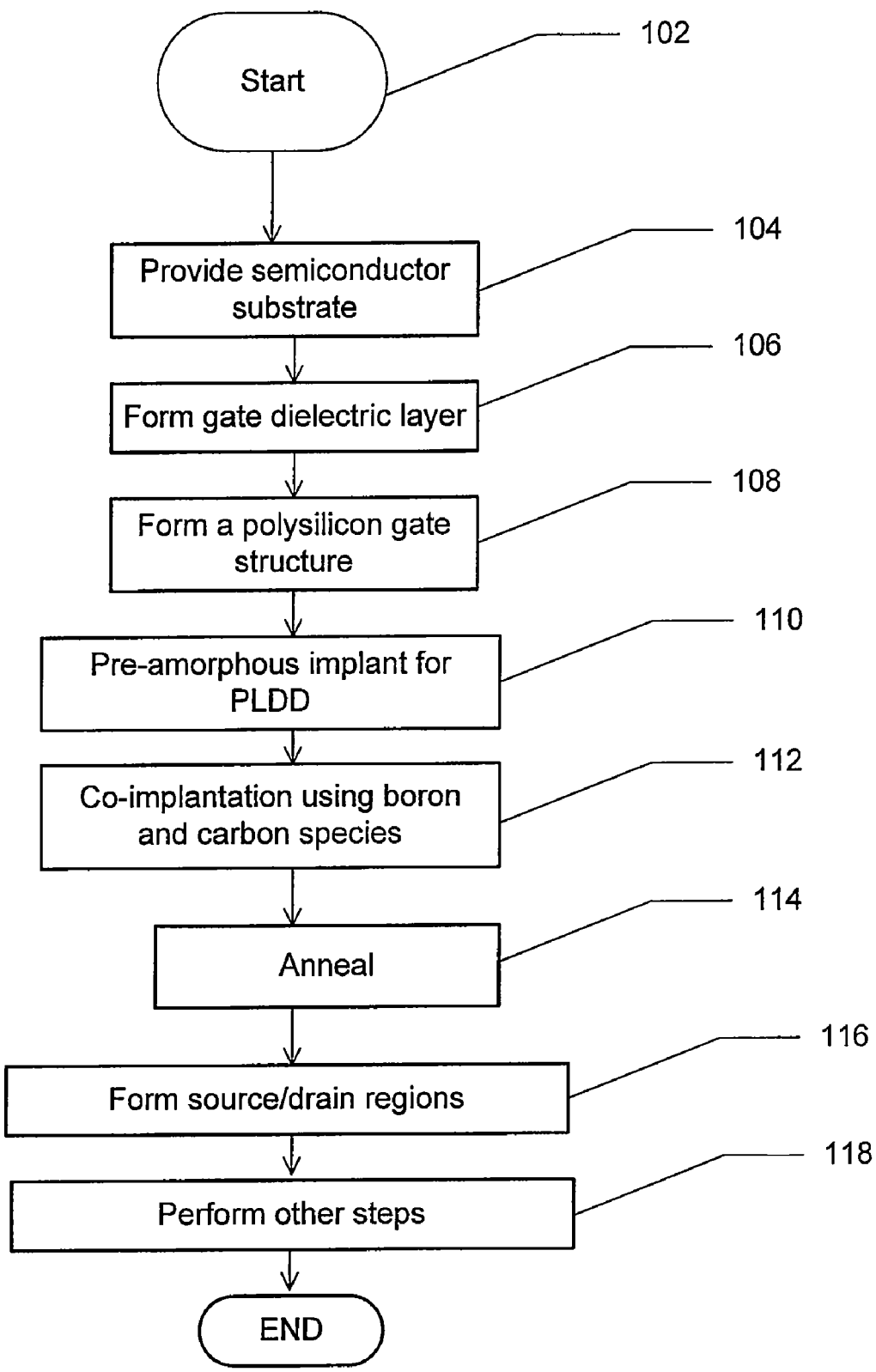
FIG. 1 is a simplified flow diagram illustrating a method for forming an ultra shallow lightly doped drain region for a MOS device according to an embodiment of the present invention.

FIG. 1 is a simplified process flow diagram illustrating a method for forming a P doped lightly doped drain structure according to an embodiment of the present invention. The method starts with a Start step (Step 102). The method includes providing a semiconductor substrate (Step 104) having a surface region. The semiconductor substrate can be single crystal silicon, silicon germanium, silicon on insulator and the like. The method includes forming a gate dielectric layer overlying the surface region (Step 106). The gate dielectric layer can be silicon oxide formed by suitable techniques such as thermal growth, chemical vapor deposition, plasma enhanced deposition process and the like. The method includes forming a gate structure overlying the gate dielectric layer (Step 108). In a specific embodiment, the gate structure can be formed by depositing, patterning and etching a doped polysilicon material to form a polysilicon gate structure. Depending on the embodiment, the polysilicon gate structure may include an overlying silicide layer. The method includes performing a pre-amorphous implant step within a lightly doped drain region using species such as germanium and the like (Step 110). The method includes performing a co-implantation process using a P type impurity such as boron bearing species and a carbon species to form a PLDD region in a specific embodiment (Step 112). The method provides a thermal process, for example, spike anneal, rapid thermal anneal to activate the P type impurity within the PLDD region (Step 114). The method also includes forming source/drain regions within the semiconductor substrate (Step 116). The method performs other steps to complete the MOS structure (Step 118). Of course there can be other variations, modifications, and alternatives.

The above sequence of steps provides a method of forming an ultra shallow PLDD region for a MOS device according to an embodiment of the present invention. As shown, the method uses a combination of steps including a way of forming an integrated circuit device for a CMOS integrated circuit. As shown, the method includes using a pre-amorphous process and a co-implantation process to form the ultra shallow PLDD region for the MOS device according to an embodiment of the present invention. Other alternatives can also be provided where steps are added, one or more steps are removed, or one or more steps are provided in a different sequence without departing from the scope of the claims herein. Further details of the present method can be found throughout the present specification and particularly below.

Figure 2:
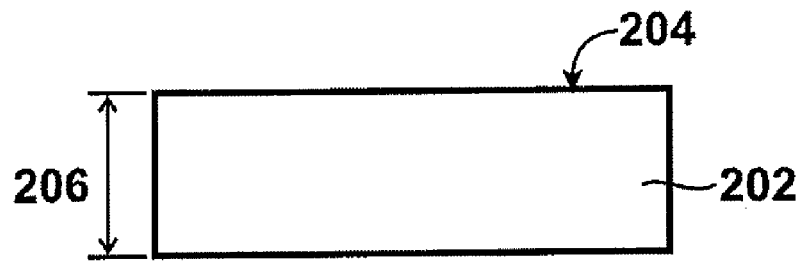
FIGS. 2-7 are simplified diagrams illustrating a method of fabricating a MOS device having an ultra shallow lightly doped drain region according to an embodiment of the present invention.

FIGS. 2-7 are simplified diagrams illustrating a method of fabricating a MOS device according to an embodiment of the present invention. As shown in FIG. 2, the method includes providing a semiconductor substrate 202 having a surface region 204 and a thickness 206. The semiconductor substrate can be a single crystal silicon, silicon germanium, silicon on insulator, and the like. In a specific embodiment, the semiconductor substrate is a single crystal silicon wafer having a P type impurity characteristics.

Figure 3:
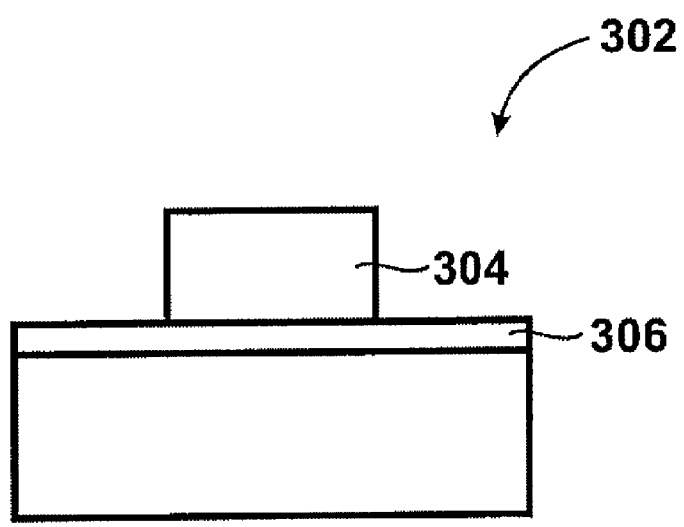

Referring to FIG. 3, the method includes providing a MOS structure 302 in a portion of the semiconductor substrate. In a specific embodiment, the MOS device structure includes a gate structure 304 overlying a gate dielectric layer 306. As shown, the gate dielectric layer overlies the surface region of the semiconductor substrate. In a specific embodiment, the gate dielectric layer may include silicon oxide provided using suitable techniques. These techniques can include thermal growth, chemical vapor deposition, including plasma enhanced process, atomic layer deposition among others. Alternatively, the gate dielectric layer may be a multilayer dielectric stack, such as a silicon oxide on silicon nitride on silicon oxide stack. In a specific embodiment, the gate structure can be made from a doped polysilicon material using deposition, patterned and etch techniques. In certain embodiments, the gate structure may include an overlying silicide material, for example, cobalt silicide, nickel silicide, tungsten silicide, or others depending on the application. Of course, there can be other variations, modifications, and alternatives.

Figure 4:
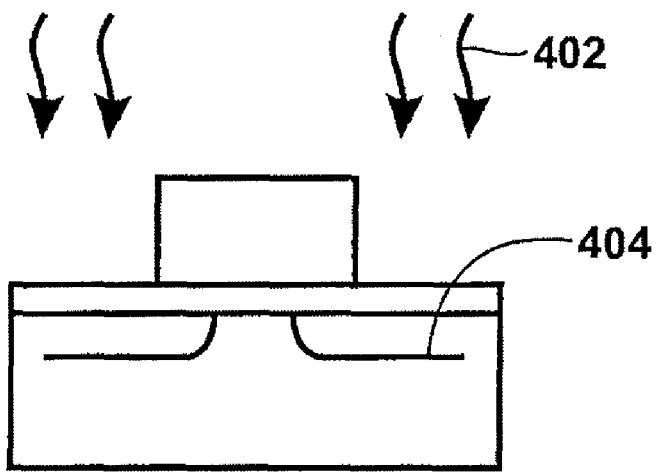

As shown in FIG. 4, the method includes performing a first implantation process 402 to cause at least an extended region 404 to source/drain regions to form an amorphous region within at least the extended region of the source drain regions. As shown, the first implantation uses at least the gate structure as a mask. The extended region provides for an ultra shallow lightly doped drain (LDD) region for the MOS device. In a preferred embodiment, the ultra shallow lightly doped drain LDD region is characterized by a depth less than about 500 Angstroms. In a specific embodiment, the amorphous region may be formed by a first implantation process using a suitable impurity species. Such impurity species can include a germanium species provided using a zero angle implantation in a specific embodiment. The germanium species may be provided using germane ($GeH_4$) at a dose ranging from about $5 \times 10^{14}$ to about $5 \times 10^{16}$ atoms per $cm^2$ and at an energy of about 10 keV to about 50 keV, but can be others. Alternatively, the germanium species may be provided using other suitable precursors depending on the embodiment. Of course, there can be other variations, modifications, and alternatives.

Figure 5:
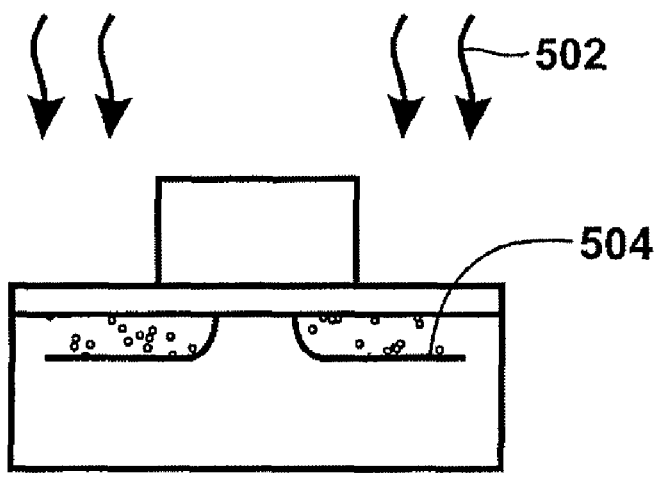

In a specific embodiment, the method includes performing a second implantation process 502 within the ultra shallow lightly doped drain regions using a suitable impurity species as shown in FIG. 5. In a specific embodiment, the second implantation process includes using a P type impurity species at an implant angle of about zero to form a PLDD region 504 within the ultra shallow lightly doped drain region. An example of such P type impurity species may include boron provided using a precursor such as $BF_2$ species provided at a dose ranging from about $1 \times 10^{13}$ atoms per $cm^2$ to about $1 \times 10^{15}$ atoms per $cm^2$ and at an implant energy ranging from about 4.5 KeV to about 10 KeV, but can be others depending on the application. Other boron precursors may include borane, diborane, and others. In a preferred embodiment, the second implantation process uses a carbon species as a co-implantation species. In a specific embodiment, the carbon species can be provided using a suitable hydrocarbon. The carbon species provides carbon atoms occupying interstitial sites of the silicon crystal lattice. In a preferred embodiment, the carbon species maintains impurity such as boron within the PLDD region in a subsequent thermal process. That is, the carbon species prevents lateral interstitial boron diffusion in the subsequent thermal process in a specific embodiment. Of course, there can be other variations, modifications, and alternatives.

In a specific embodiment, the method includes performing a first thermal process to activate the impurity within the ultra shallow PLDD region. In a specific embodiment, the thermal process can be a spike anneal provided at a temperature ranging from 650 degrees Celsius to 800 degrees Celsius in a time period of 20 seconds to 40 seconds. Alternatively, the thermal process can be a rapid thermal process (RTP) depending on the embodiment. Of course there can be other variations, modifications, and alternatives.

Figure 6:
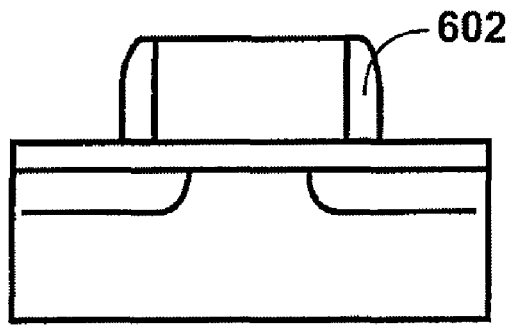

Referring to FIG. 6, the method includes forming side wall spacers 602 overlying a portion of the gate structure. The side wall spacers uses a dielectric material such as silicon oxide or silicon nitride, or a multilayer stack such as a silicon oxide on silicon nitride on silicon oxide (commonly called ONO) depending on the embodiment. The side wall spacers can be formed using a conformal deposition of the dielectric material followed by a selective etching process known in the art. The side wall spacers protect and isolate the gate structure. Of course there can be other variations, modifications, and alternatives.

Figure 7:
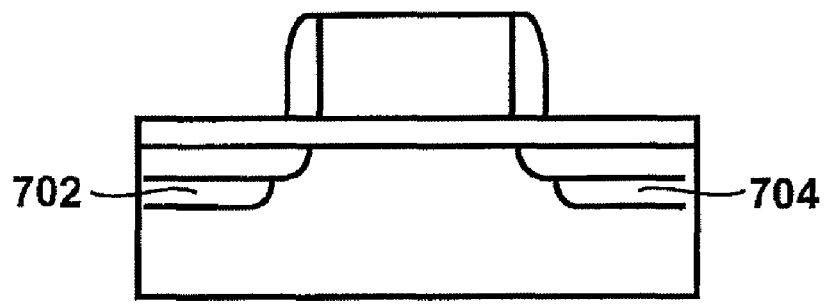

As shown in FIG. 7, the method includes forming source/drain regions 702, 704 for the MOS device structure in a vicinity of the surface region with the semiconductor substrate. In a specific embodiment, the source/drain regions can be formed using a third implant process using the gate structure and the side wall spacers as a masking layer. In a specific embodiment, the third implant process uses suitable P type impurity species such as boron. In a preferred embodiment, the third implant process is provided utilizing an energy ranging from 10 KeV to 50 KeV, a dose ranging from $1 \times 10^{15}$ cm$^{-2}$ to about $5 \times 10^{16}$ cm$^{-2}$ and at a zero implant. Other implantation parameters may be used depending on the embodiment. Of course, there can be other variations, modifications, and alternatives.

Figure 8:
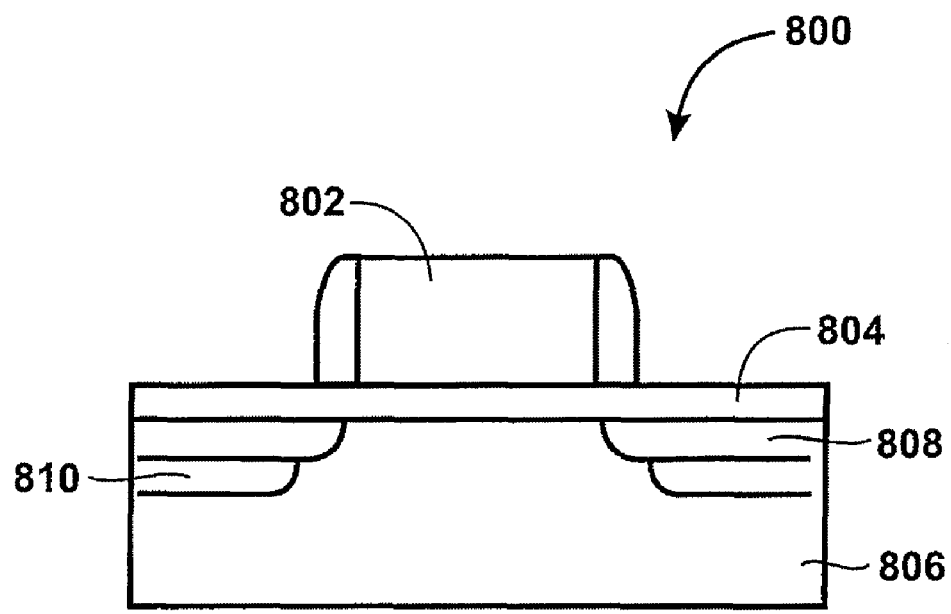
FIG. 8 is a simplified diagram illustrating a MOS device structure according to an embodiment of the present invention.

FIG. 8 is a simplified diagram illustrating a MOS device structure 800 according to an embodiment of the present invention. As shown, the MOS device structure includes a gate structure 802, overlying a gate dielectric layer 804. The gate dielectric layer overlies a semiconductor substrate 806. The MOS device structure includes PLDD regions 808 in a portion of the semiconductor substrate. In a specific embodiment, the PLDD regions are formed using a pre-amorphous implant process followed by a co-implantation of a P-type impurity such as boron and a carbon species. The PLDD region is characterized by a depth of 500 Angstroms and less and prevents punch through at an early bias for the MOS device. The MOS device structure also includes active source/drain regions 810 in the semiconductor substrate adjacent to the gate structure. In a specific embodiment, the MOS device is fabricated using a 65 nm and less design rule.

Effectively the amorphous region caused by germanium implantation improves an abruption profile and a sheet resistance characteristics for the PLDD region in a specific embodiment. Germanium implantation provides sites within the PLDD regions to improve active dopant (for example, boron) implantation and sheet resistance characteristics of the PLDD region in a specific embodiment. Additionally, carbon occupies interstitial sites of the silicon crystal lattice and prevents lateral out-diffusion of, for example active boron species from the ultra shallow PLDD region in the first thermal process. The boron species concentration within the ultra shallow PLDD region is maintained and the channel length of the MOS device can be maintained without punch through at an early bias.

Figure 10:
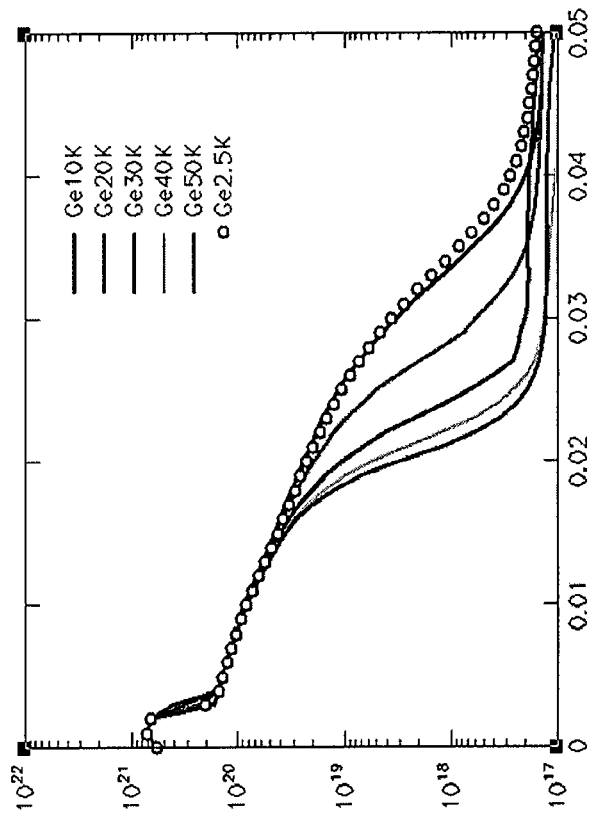
Figure 9:
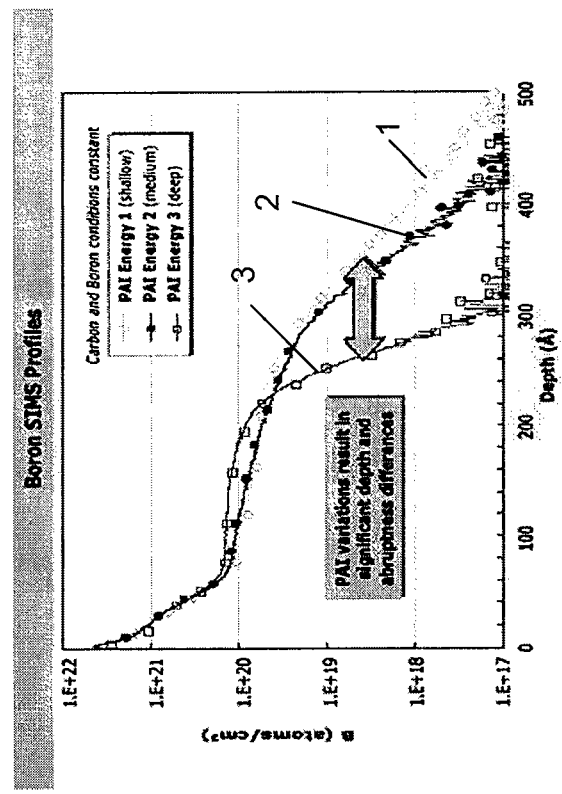

FIGS. 9-15 are simplified diagrams exemplified experiment results according to embodiments of the present invention. FIG. 9 illustrates results of boron secondary ion mass spectrometry (SIMS) profile from various germanium pre-implant energies while the subsequent co implantation parameters of boron and carbon are the same. As shown, vertical axis illustrates boron concentration and horizontal axis illustrates depth from a silicon surface of the LDD region. As shown in FIG. 9, plots 1-3 are SIMS profiles of boron in the LDD region in a shallow pre-germanium implant, a medium depth pre-germanium implant, and deep pre-germanium implant respectively, while the conditions are the same for subsequent boron and carbon co-implantation. As shown, diffusion of boron species in a subsequent activation step by a thermal process, or a thermal enhanced transient (TED) is reduced when germanium is provided to a greater depth. The simulated boron depth profile using TCAD within silicon as a function of germanium implant energy is illustrated in FIG. 10. As shown, the simulated profile agrees well with empirical result shown in FIG. 9.

Figure 11:
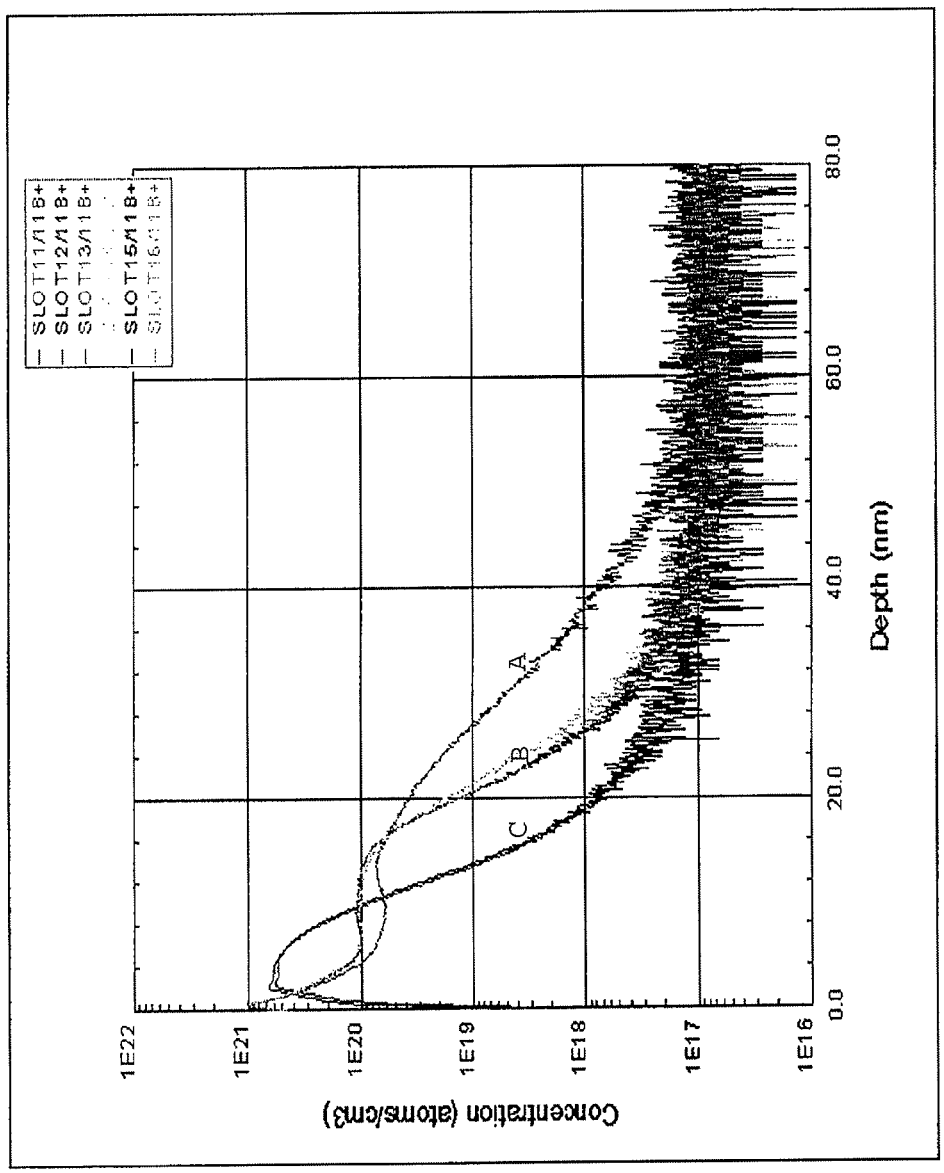

FIG. 11 is a simplified plot illustrating the effect of germanium pre-amorphous implant and carbon co-implant on boron doping profiles according to an embodiment of the present embodiment. As shown, plot A is boron doping profile without carbon co-implant, the boron profile shows TED effect, that is boron diffuses to a depth of more than 40 nm after thermal activation. Plot B is a boron doping profile using carbon as co-implant species, TED effect is reduced. Plot C is a boron doping profile using germanium pre-amorphous implant. The activation rate is enhanced as a result.

Figures 12, 13:
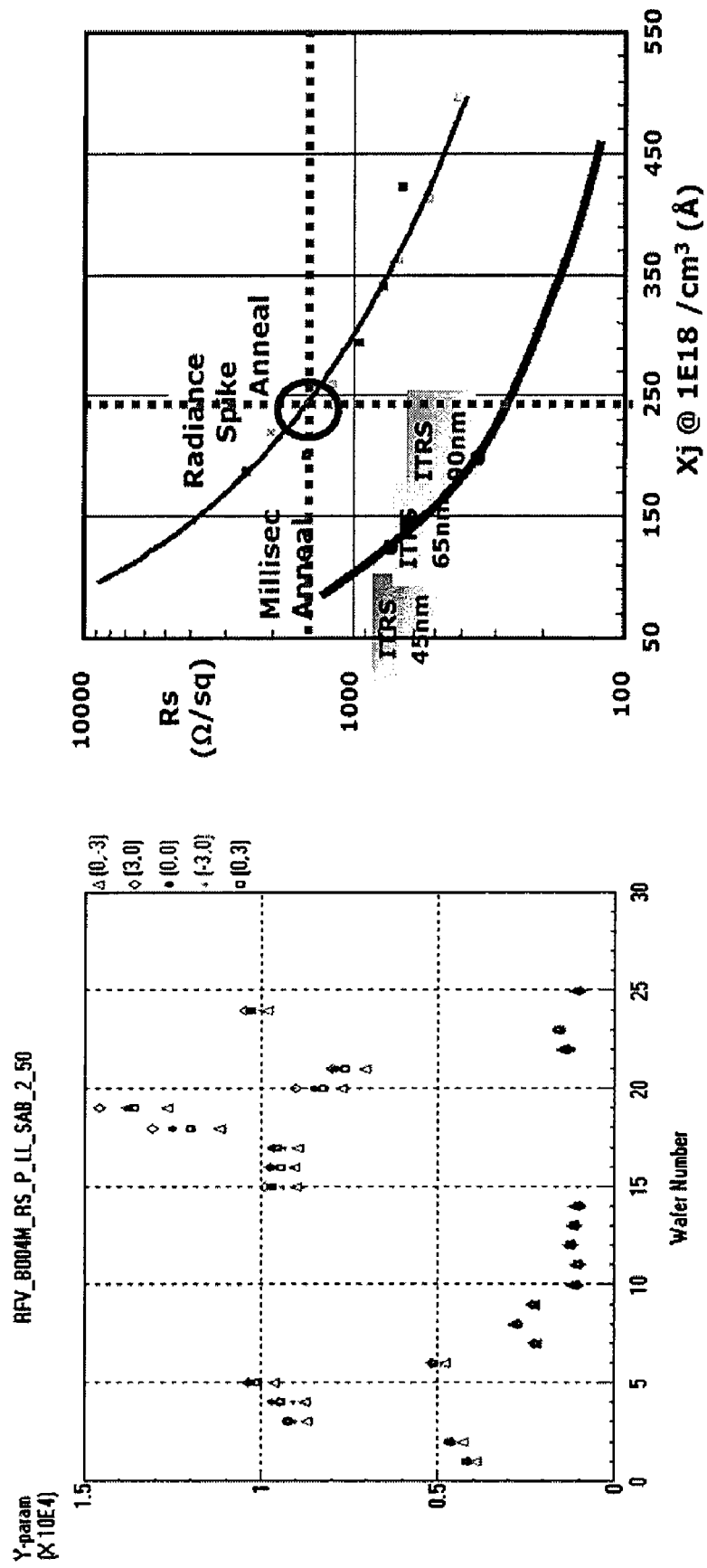

FIG. 12 is a simplified plot showing sheet resistance results according to embodiments of the present invention. As shown, sheet resistance results for wafers numbered 1 to 25 is provided. Wafers 10 to 14 are pre-amorphous implanted with high energy germanium, sheet resistance is much reduced for wafers 10-14 and meets the requirement for ITRS 65 nm node devices as illustrated in FIG. 13.

Referring to FIG. 13, a simplified plot of relative sheet resistance versus boron implant depth is illustrated. As shown, relative sheet resistance ($R_s$ in Ω/sq) is provided on the vertical axis and germanium implant depth (in Angstrom) at a dose of $1 \times 10^{18}$ per cm$^3$ is provided on the horizontal axis. As shown, the relative sheet resistance decreases with an increase in germanium implant depth.

FIGS. 14 and 15 are simplified plots illustrating device performance according to an embodiment of the present invention. As show in FIGS. 14 and 15, threshold voltage ($V_{th}$) is illustrated on the vertical axis and drive current (for example, saturated source drain current $ID_{SAT}$) is illustrated on the horizontal axis for both FIG. 14 and FIG. 15. Plot A in FIG. 14 is a simplified plot of threshold voltage versus drive current for devices with LDD regions not pre-implanted with germanium. Plot C in FIG. 15 is a simplified plot of threshold voltage versus drive current for devices with LDD regions pre-implanted with germanium. As illustrated in FIGS. 14 and 15, the threshold voltage characteristics is improved.

Although the above has been illustrated according to a specific embodiment, there can be other modifications, alternatives, and variations. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a MOS device with an ultra shallow lightly doped diffusion region, the method comprising:

providing a semiconductor substrate including a surface region;

providing a gate dielectric layer overlying the surface region;

forming a gate structure overlying a portion of the gate dielectric layer;

performing a first implant process using a germanium species to form an amorphous region within a lightly doped drain region in the semiconductor substrate using the gate structure as a mask;

performing a second implant process in the lightly doped drain region using a P type impurity and a carbon species using the gate structure as a mask;

performing a first thermal process to activate the P type impurity in the lightly doped drain region;

forming side wall spacers overlying a portion of the gate structure;

performing a third implant process using a first impurity to form active source/drain regions in a vicinity of the surface region of the semiconductor substrate adjacent to the gate structure using the gate structure and the side wall spacers as a masking layer; and performing a second thermal process to activate the first impurity in the active source/drain regions;

wherein the P type impurity is provided using a $BF_2$ precursor at an implant energy of 4.5 KeV to 10 KeV;

wherein the first thermal process is a spike anneal process provided at a temperature ranging from 650 degrees Celsius to 800 degrees Celsius, wherein the second thermal process is a rapid thermal process provided at a temperature ranging from 700 degrees Celsius to 1000 degrees Celsius for a time period of 5 seconds to 10 seconds.

2. The method of claim 1 wherein the semiconductor substrate can be single crystal silicon, silicon germanium, or silicon on insulator (SOI).

3. The method of claim 1 wherein the P-type impurity is provided using a boron species.

4. The method of claim 1 wherein the precursor $BF_2$ is provided at a dose ranging from $1\times10^{13}$ to $1\times10^{15}$ atoms per $cm^2$.

5. The method of claim 1 wherein the germanium species comprises germane provided at a dose ranging from $5\times10^{14}$ to $5\times10^{16}$ atoms per $cm^2$ and at an energy of 10 keV to 50 keV.

6. The method of claim 5 wherein the germanium species improves a sheet resistance characteristics of the lightly doped drain region.

7. The method of claim 1 wherein the second implant process includes co-implantation of at least a boron species and a carbon species.

8. The method of claim 7 wherein the carbon species is provided by a hydrocarbon.

9. The method of claim 7 wherein the carbon species reduce a transient enhanced diffusion resulting from the second implant process.

10. The method of claim 1 wherein the lightly doped drain region is characterized by a depth of 500 Angstroms and less.

11. The method of claim 1 wherein the first thermal process is performed in a time period of 20 seconds to 40 seconds.

12. The method of claim 1 wherein the first impurity comprises an N-type impurity.

13. The method of claim 1 wherein the first impurity comprises a P-type impurity.

14. The method of claim 1 wherein the third implant process is provided at an energy ranging from 10 keV to 50 keV at a dose ranging from $1\times10^{15}$ $cm^{-2}$ to $5\times10^{16}$ $cm^{-2}$ at a zero implant angle.

* * * * *